US010609836B2

(12) United States Patent
Belady et al.

(10) Patent No.: US 10,609,836 B2
(45) Date of Patent: Mar. 31, 2020

(54) DC BUS ARCHITECTURE FOR DATACENTERS

(71) Applicant: Microsoft Technology Licensing, LLC, Redmond, WA (US)

(72) Inventors: Christian L. Belady, Mercer Island, WA (US); Brian Janous, Redmond, WA (US); David Thomas Gauthier, Seattle, WA (US); Sean M. James, Olympia, WA (US); Osvaldo P. Morales, Normandy Park, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/976,374

(22) Filed: May 10, 2018

(65) Prior Publication Data

US 2019/0350105 A1 Nov. 14, 2019

(51) Int. Cl.
*H05K 7/14* (2006.01)

(52) U.S. Cl.
CPC ................................. *H05K 7/1492* (2013.01)

(58) Field of Classification Search
CPC .................................................. H05K 7/1492
USPC ....................................................... 361/622
See application file for complete search history.

(56) References Cited

U.S. PATENT DOCUMENTS

| 6,153,946 A | 11/2000 | Koch et al. | |
|---|---|---|---|
| 6,433,522 B1 * | 8/2002 | Siri | G05F 1/67 320/101 |
| 9,698,589 B1 * | 7/2017 | Leyh | H02H 3/087 |
| 2011/0096522 A1 | 4/2011 | Humphrey et al. | |
| 2011/0102996 A1 | 5/2011 | Janick et al. | |
| 2011/0148194 A1 * | 6/2011 | Lai | H02J 7/0055 307/23 |
| 2012/0326516 A1 * | 12/2012 | Gurunathan | H02J 1/00 307/72 |
| 2016/0274638 A1 | 9/2016 | Kwon | |

(Continued)

FOREIGN PATENT DOCUMENTS

DE  202017105809 U1  12/2017

OTHER PUBLICATIONS

"International Search Report and Written Opinion Issued in PCT Application No. PCT/US2019/030500", dated Jun. 21, 2019, 11 Pages.

(Continued)

*Primary Examiner* — Mukundbhai G Patel
(74) *Attorney, Agent, or Firm* — Liang IP, PLLC

(57) ABSTRACT

A bus architecture for supplying power to a datacenter. A first DC bus includes a first DC bus conductor, a first power source and a first diode having a cathode connected to the first DC bus conductor. The first DC bus includes a first converter connected to the first power source and to an anode of the first diode. Power output by the first power source via the first converter is supplied at a first voltage level. The first DC bus includes a first plurality of loads and a first plurality of DC/DC converters connecting the first plurality of loads to the first DC bus conductor, respectively. The first DC bus includes a second diode having a cathode connected to the first DC bus conductors. A first uninterruptable power supply is connected to an anode of the second diode and operates at a second voltage level.

19 Claims, 16 Drawing Sheets

(56) References Cited

U.S. PATENT DOCUMENTS

2017/0110877 A1* 4/2017 Reddy ................. H02J 1/12
2017/0194791 A1* 7/2017 Budde ................. G06F 1/263

OTHER PUBLICATIONS

"International Search Report and Written Opinion Issued in PCT Application No. PCT/US2019/030501", dated Jun. 21, 2019, 12 Pages.

* cited by examiner

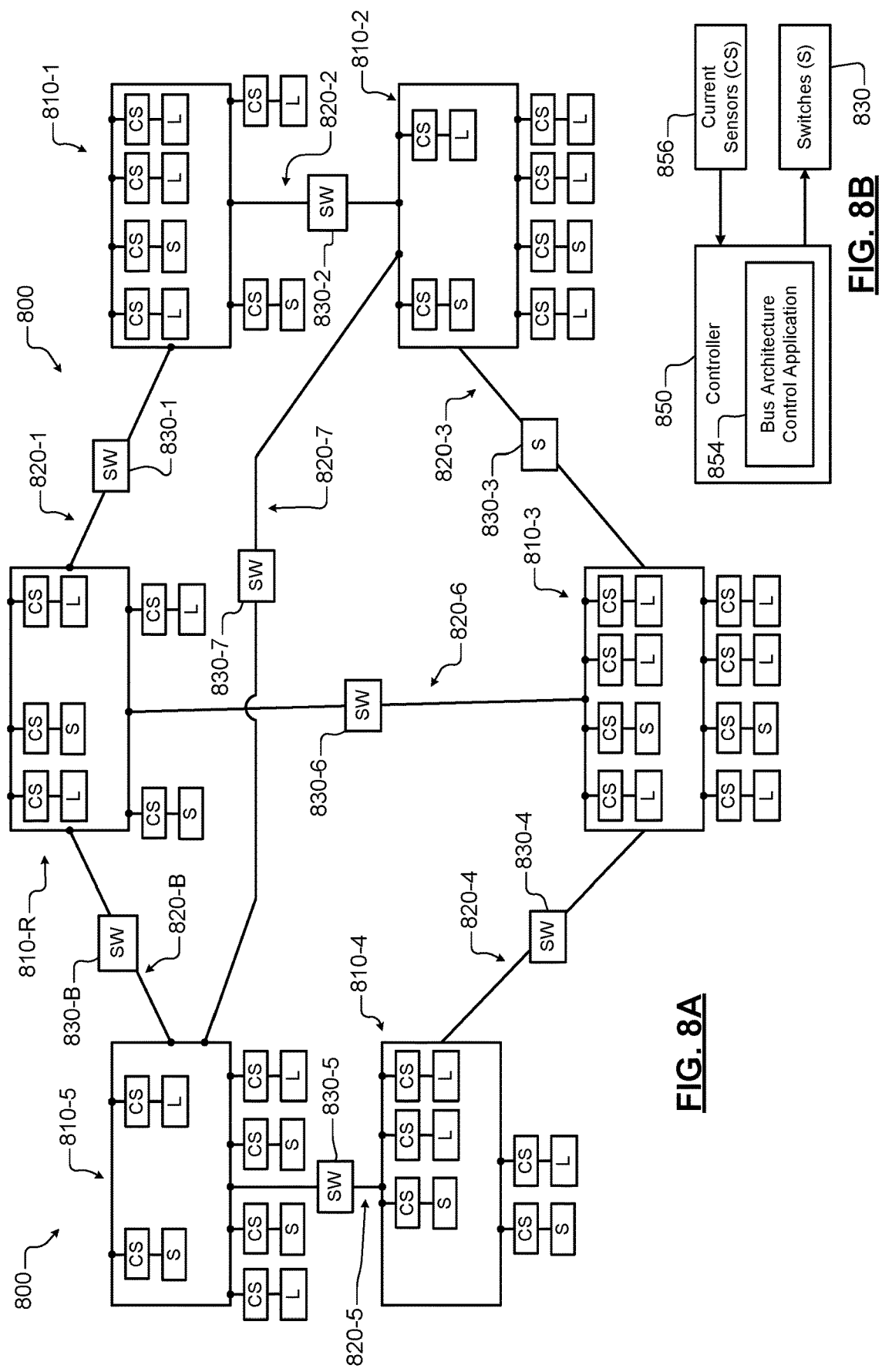

DC BUS ARCHITECTURE FOR DATACENTERS

FIELD

The present disclosure relates to power bus architectures, and more particularly to DC power bus architectures for datacenters.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Datacenter utilization is generally poor because the datacenter infrastructure is constructed for the highest capacity that is forecasted. Initially the datacenter operates well below the forecasted capacity. Adding power/load capacity to a conventional datacenter is inherently risky because of the potential to put a fault on the system and take down live servers. Additional power sources must be provided to a power bus that supplies racks of servers and/or storage arrays.

Referring now to FIG. 1, a first bus architecture 10 is shown to include an AC signal source 12 such as a utility. An output of the AC signal source 12 is connected by one or more circuit breakers 14 and a transformer 16 to an uninterruptible power supply (UPS) 20 and one or more branch circuits 22. The branch circuits 22 may be used to supply non-essential loads such as lighting.

The UPS 20 provides standby power to essential loads in the event that the AC signal source 12 is unavailable. The UPS 20 typically includes an AC/DC converter 24 to convert the AC input to a DC signal. The AC/DC converter 24 is connected to a DC/DC converter 28 and a DC/AC converter 30. The DC/DC converter 28 is connected to an array of batteries 34 that are charged when the AC signal source 12 is available. When the AC signal source 12 fails, the array of batteries 34 provide backup power to the essential loads for a predetermined period. The DC/AC converter 30 is connected to a first AC bus 36A.

A plurality of loads generally identified at 40 may be connected to the first AC bus 36A. Examples of the loads include server racks 44 and/or storage arrays. Each of the server racks 44 typically includes a switch or router, a plurality of servers and/or arrays of disk drives. Other datacenter loads include lights, fans and pumps for cooling, air conditioning equipment, etc. The server racks 44 are typically connected by a circuit breaker 46, an AC/DC converter 48 and a DC/DC converter 50 to the server racks 44. In some examples, AC power is delivered to the server racks 44 and then within each server or server chassis, AC/DC and DC/DC conversion is performed. In other words, the server racks 44 include the AC/DC converter 48 and the DC/DC converter 50 in some examples.

A second AC bus 36B with a similar architecture can be provided. In some examples, some of the loads 40 may be connected to the first AC bus 36A and the second AC bus 36B. Example loads include motors and AC drive circuits for cooling pumps or other devices.

As can be appreciated, when additional loads need to be connected to one or both of the first and second AC busses 36A and 36B, additional power supply capacity is also needed. However, issues such as synchronization of the AC frequency of additional AC signal sources added to one or both of the existing AC signal sources 12 may cause system faults. Datacenters typically have uptime constraints and cannot be taken off-line due to system faults. Since it is difficult to safely add additional power sources to this bus architecture without problems, the power bus is typically sized a lot larger than necessary when originally constructing the datacenter to deliver the largest amount of power that is anticipated to be needed in the future. This increases the overall cost of installation without an equivalent source of revenue until load capacity grows.

Referring now to FIG. 2, a DC bus architecture 50 that can also be used for datacenters is shown. In this architecture, an AC power source 52 such as a utility is connected by one or more circuit breakers 54 and a transformer 26 to an AC/DC converter 58. The AC/DC converter 58 is connected to a first DC bus 62A. An uninterruptible power source (UPS) 64 includes an array of batteries 66 that is connected by a DC/DC converter 68 to the first DC bus 62A to provide power for a predetermined period in the event that the AC power source 52 is unavailable. A plurality of loads generally identified at 74 is connected to the first DC bus 62A.

A second DC bus 62B having a similar architecture as the first DC bus 62A can be provided. In some examples, some of the loads 74 may be connected to both the first DC bus 62A and the second DC bus 62B.

When increasing capacity, it is difficult to add additional AC signal sources to provide additional power on the DC bus due to synchronization of the AC signal sources and other issues.

SUMMARY

A bus architecture for supplying power to loads in a datacenter includes a first DC bus. The first DC bus includes a first DC bus conductor, a first power source and a first diode having a cathode connected to the first DC bus conductor. The first DC bus includes a first converter connected to the first power source and to an anode of the first diode. Power output by the first power source via the first converter is supplied at a first voltage level. The first DC bus includes a first plurality of loads and a first plurality of DC/DC converters connecting the first plurality of loads to the first DC bus conductor, respectively. The first DC bus includes a second diode having a cathode connected to the first DC bus conductors. A first uninterruptable power supply is connected to an anode of the second diode and operates at a second voltage level that is less than the first voltage level.

In other features, the first DC bus conductor is connected in a ring configuration. The first plurality of loads comprises a server rack including a switch and a plurality of servers.

The bus architecture further includes a second DC bus including a second DC bus conductor, a second power source and a third diode having a cathode connected to the second DC bus conductor. A second converter is connected to the second power source and to an anode of the third diode. Power output by the second power source via the second converter of the second DC bus is supplied at the first voltage level. The second DC bus includes a second plurality of loads and a second plurality of DC/DC converters connecting the second plurality of loads to the second DC bus conductor. The second DC bus includes a fourth diode having a cathode connected to the second DC bus conductors. A second uninterruptable power supply is connected to an anode of the fourth diode and operates at the second voltage level.

In other features, a bridging bus conductor connects the first DC bus conductor of the first DC bus to the second DC bus conductor of the second DC bus. The first DC bus conductor is connected in a ring configuration and the second DC bus conductor is connected in a ring configuration.

In other features, a connecting component is selected from a group consisting of a switch, a circuit breaker, a diode and anti-parallel diodes. A bridging bus conductor connects the connecting component between the first DC bus conductor of the first DC bus and the second DC bus conductor of the second DC bus.

In other features, adding additional power supply capacity to the first DC bus includes connecting a second power source operating at the first voltage level to the DC bus conductor without AC synchronization. Adding additional load capacity to the first DC bus includes connecting a second plurality of loads to the DC bus conductor. A plurality of diodes connects the first plurality of loads to the DC bus conductor using.

A method for supplying power to loads in a datacenter includes creating a first DC bus by providing a first DC bus conductor. The method includes providing power to the first DC bus conductor at a first voltage level by connecting a first power source to a first converter; connecting the first converter to an anode of a first diode; and connecting a cathode of the first diode to the first DC bus conductor. The method includes connecting a first plurality of loads to the DC bus conductor using a plurality of DC/DC converters, respectively. The method includes providing backup power to the DC bus conductor at a second voltage level by providing a first uninterruptable power supply; connecting a cathode of a second diode to the first DC bus conductor; and connecting the first uninterruptable power supply to an anode of the second diode.

In other features, the method includes connecting the first DC bus conductor in a ring configuration. The first plurality of loads comprises a server rack including a switch and a plurality of servers.

In other features, the method includes creating a second DC bus by providing a second DC bus conductor. The method includes providing power to the second DC bus conductor of the second DC bus at the first voltage level by connecting a second power source to a second converter; connecting the second converter to an anode of a third diode; and connecting a cathode of the third diode to the second DC bus conductor. The method includes connecting a second plurality of loads to the second DC bus conductor using a second plurality of DC/DC converters, respectively. The method includes providing backup power to the second DC bus conductor at the second voltage level by providing a second uninterruptable power supply; connecting a cathode of a fourth diode to the second DC bus conductor; and connecting the second uninterruptable power supply to an anode of the fourth diode.

In other features, the method includes connecting a bridging bus conductor to the first DC bus conductor of the first DC bus and to the second DC bus conductor of the second DC bus. The method includes connecting the first DC bus conductor in a ring configuration and connecting the second DC bus conductor in a ring configuration.

In other features, the method includes providing a connecting component selected from a group consisting of a switch, a circuit breaker, a diode and anti-parallel diodes. The method includes, using a bridging bus conductor, connecting the connecting component between the first DC bus conductor of the first DC bus and the second DC bus conductor of the second DC bus.

In other features, the method includes adding additional power supply capacity to the first DC bus by connecting a second power source and a second converter to the first DC bus conductor without AC synchronization. The method includes adding additional load capacity to the first DC bus by connecting a second plurality of loads to the first DC bus conductor.

A bus architecture for supplying power to loads in a datacenter includes a first DC bus including a first DC bus conductor, a first power source selected from a group consisting of a utility, a fuel cell and a generator, and a first converter connecting to the first power source to the first DC bus conductor. The first DC bus includes a second power source selected from a group consisting of a fuel cell and a generator. A second converter connects the second power source to the first DC bus conductor without synchronization. A first plurality of DC/DC converters connects a first plurality of loads to the first DC bus conductor, respectively. A first uninterruptable power supply includes an array of batteries and a DC/DC converter connected to the first DC bus conductor.

In other features, a second DC bus has the same configuration as the first DC bus. A bridging conductor connects the first DC bus to the second DC bus.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIGS. 7A to 8B are functional block diagrams of examples of current sharing in multi-bus DC bus architectures according to the present disclosure.

In the drawings, reference numbers may be reused to identify similar and/or identical elements.

DETAILED DESCRIPTION

The present disclosure relates to DC busses and DC bus architectures for datacenters. The DC bus architecture described below provides homogeneity in the power distribution system. Additional power supply capacity can simply be added to and removed from the DC bus architecture as needed without dealing with AC synchronization issues or other open/close transition elements of conventional AC electrical distribution solutions. In addition, additional power capacity can be added using power generating components having variable sizes (such as fuel cells, generators, UPSs, etc.) to meet current power needs of the datacenter rather than fully building out the datacenter for future forecasted power capacity. In some examples, diodes, circuit breakers, switches, anti-parallel diodes or other devices may be used to isolate loads and/or sources.

Figure 1:
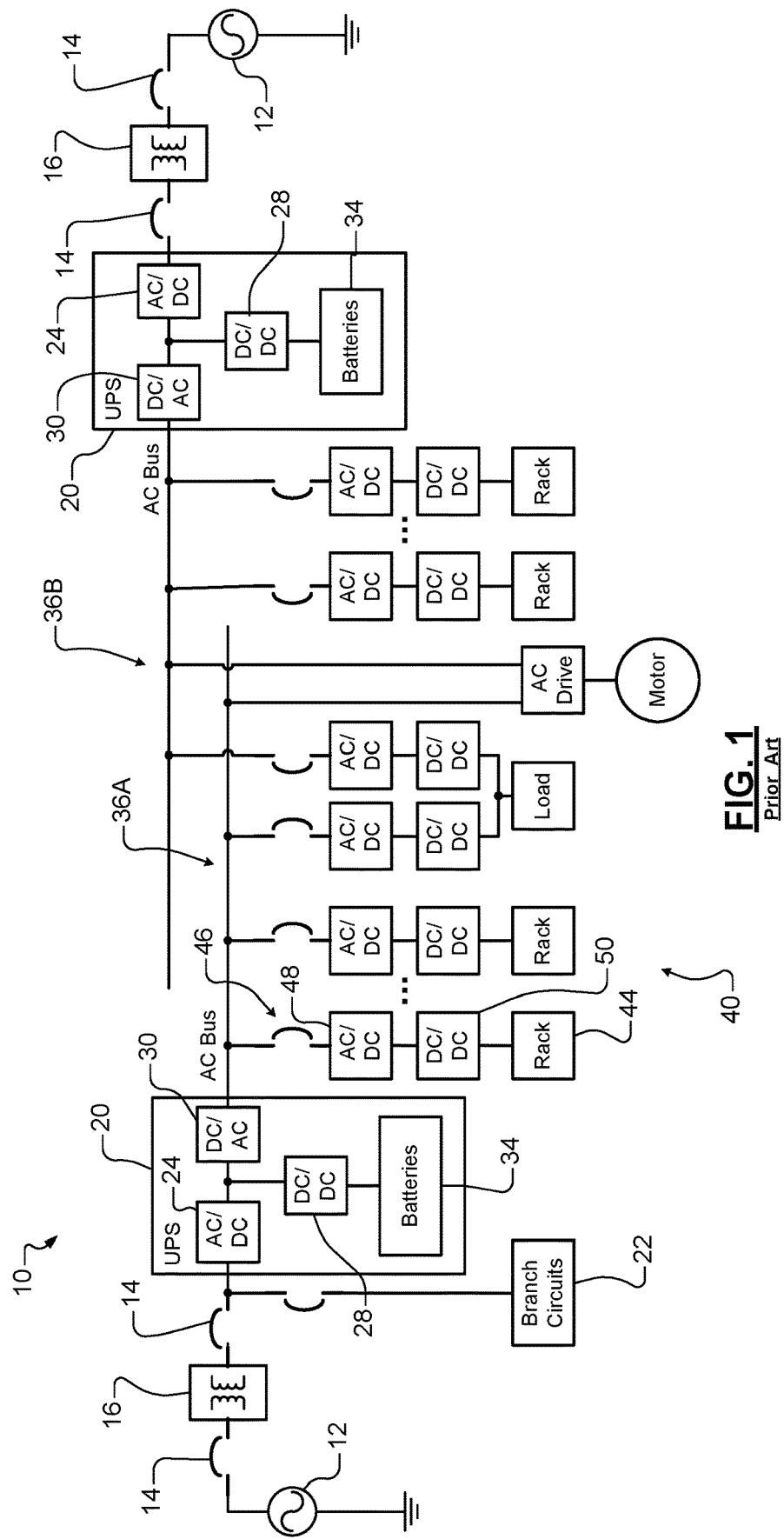
FIG. 1 is a functional block diagram of an AC bus architecture for a datacenter according to the prior art.
Figure 2:
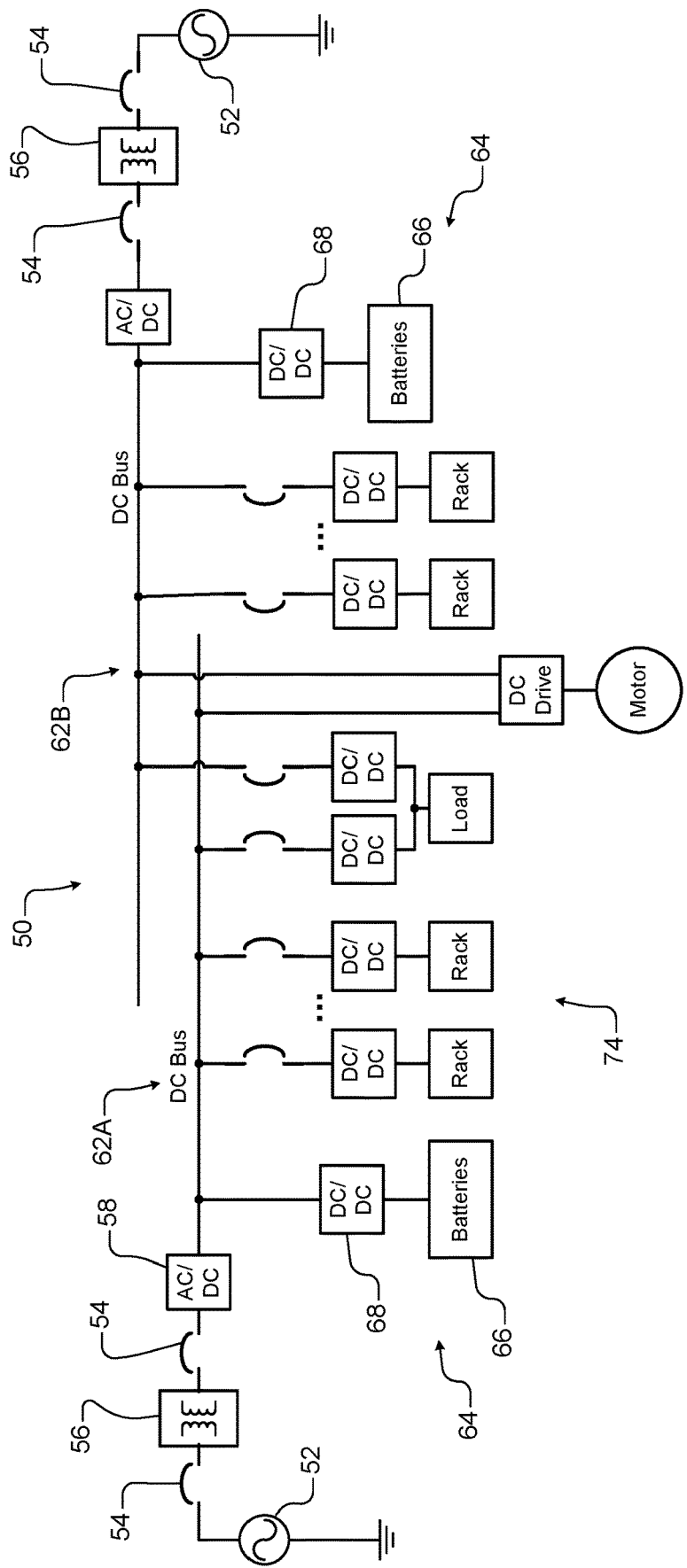
FIG. 2 is a functional block diagram of a DC bus architecture for a datacenter according to the prior art.
Figure 3A:
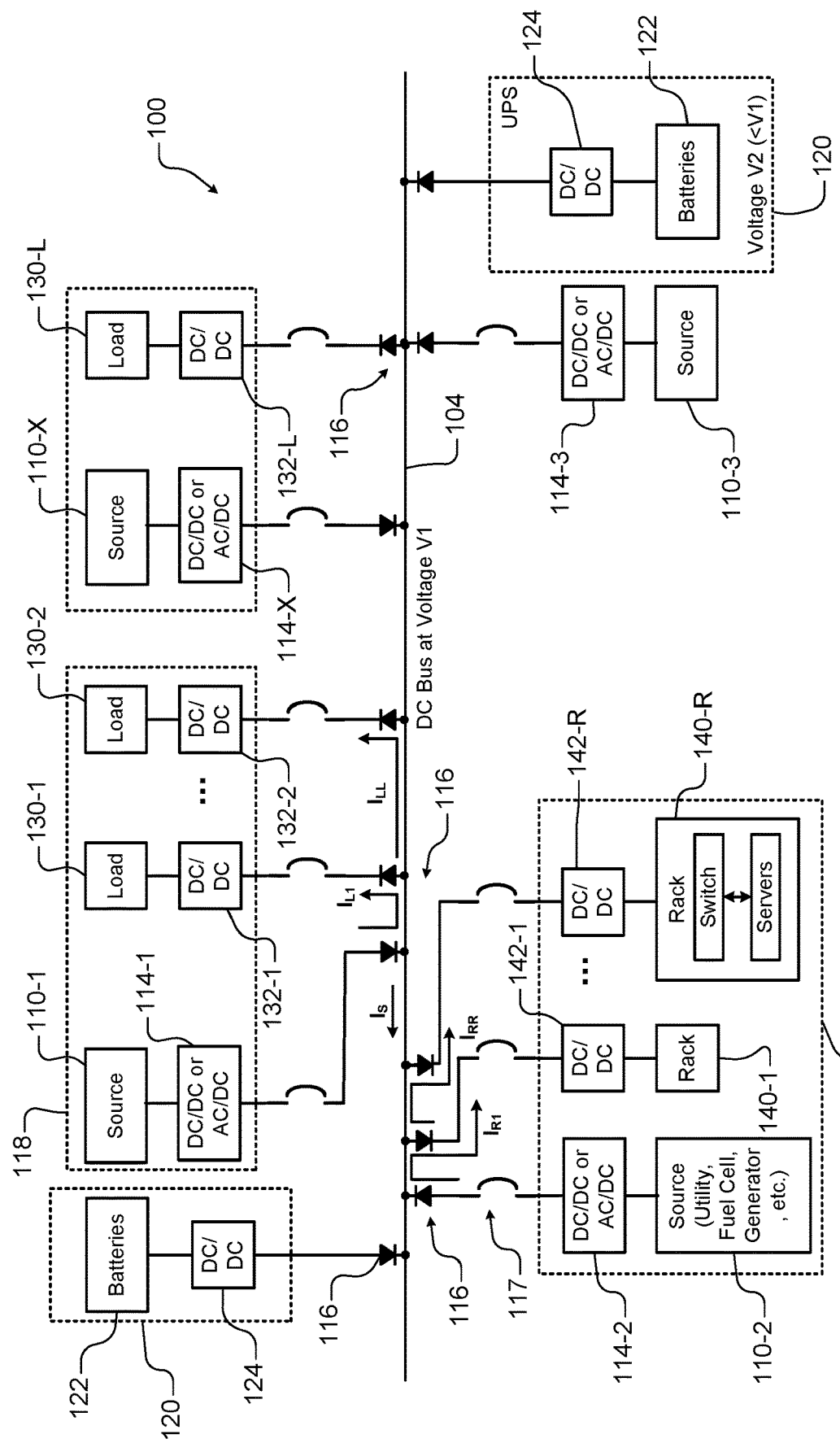
FIGS. 3A to 3C are functional block diagrams of examples of DC bus architectures according to the present disclosure.
Figure 3B:
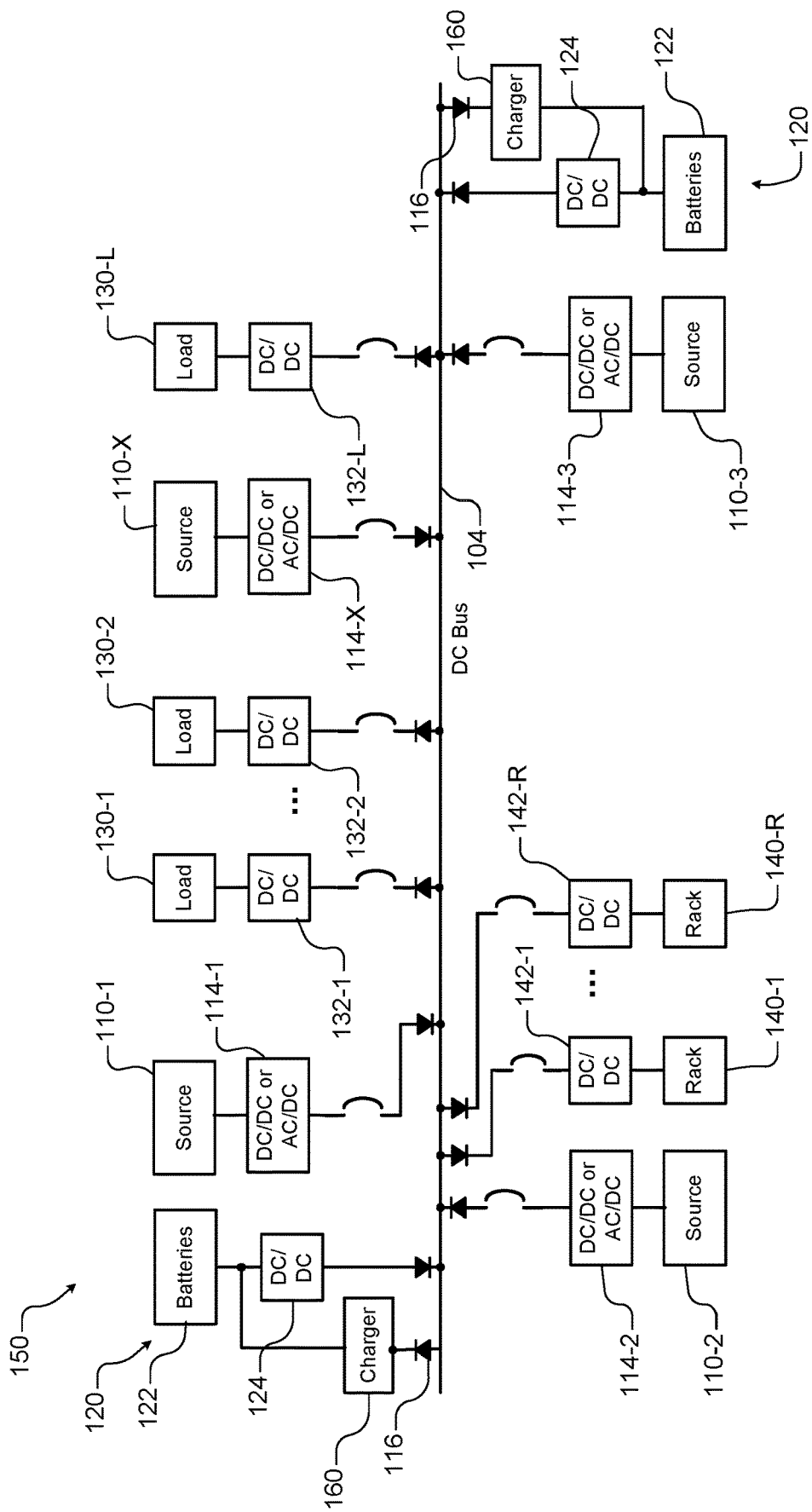
Figure 3C:
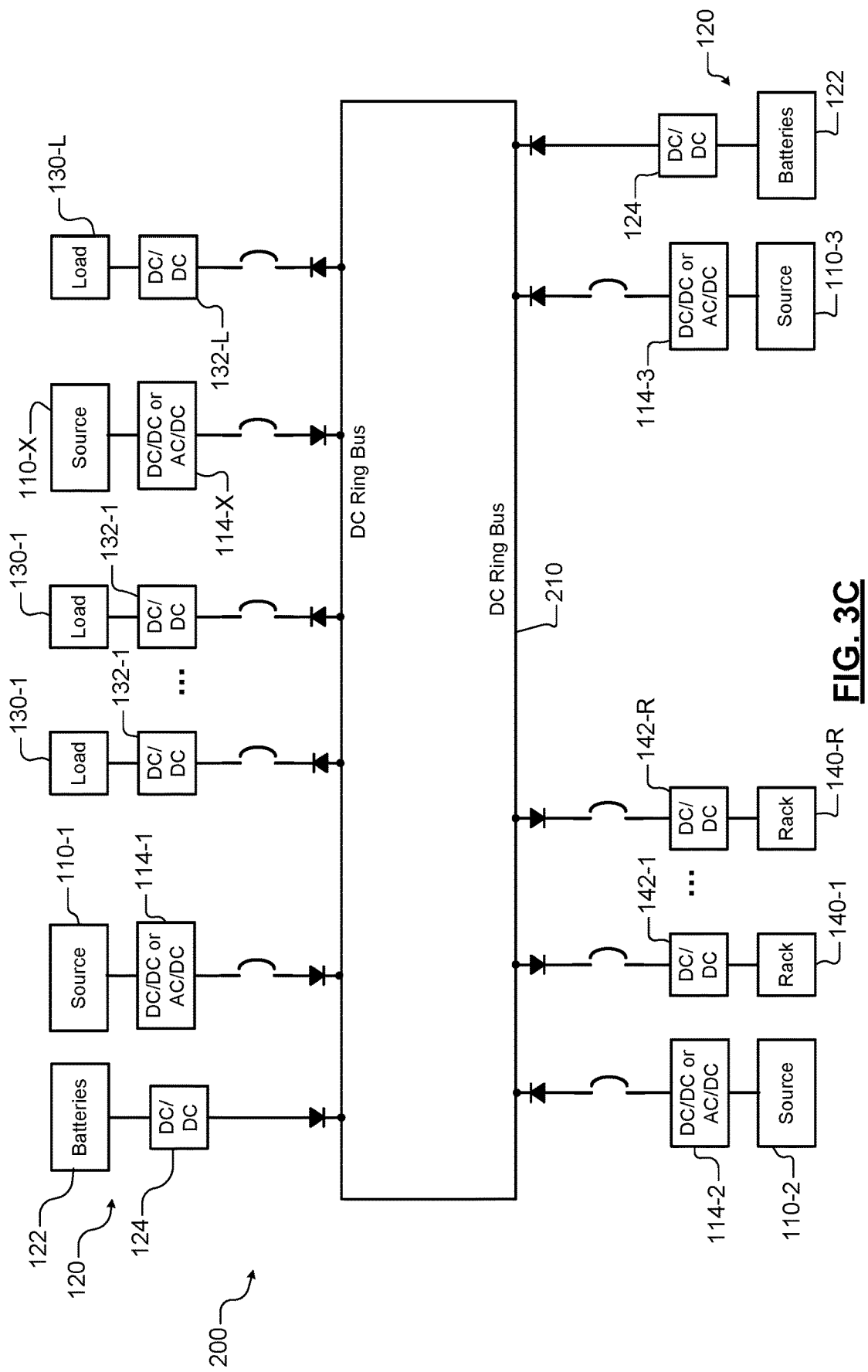

Referring now to FIGS. 3A to 3C, different DC bus architectures 100, 150 and 200 according to the present disclosure are shown. As can be appreciated, while specific arrangements of loads, sources and UPS are shown and described, the specific arrangements are meant as examples to illustrate concepts of the present disclosure. Therefore, it will be understood that the specific arrangements can be varied for a particular application.

In FIG. 3A, the DC bus architecture 100 includes one or more bus conductors 104. A plurality of power sources 110-1, 110-2, 110-3, ..., and 110-X (collectively power sources 110) (AC and/or DC) are connected by DC/DC converters or AC/DC converters (both identified as 114-1, 114-2, 114-3, ..., and 114-X) (collectively converters 114) to the bus conductors 104, where X is an integer greater than zero.

In some examples, the converters 114 are connected by diodes 116 to the bus conductors 104. If diodes are used, sources and UPSs are connected to anodes of the diodes 116 and cathodes of the diodes 116 are connected to the bus conductors 104. If diodes are used with the loads, the loads are connected to cathodes of the diodes 116 and anodes of the diodes 116 are connected to the bus conductors 104. The power sources 110 can be arranged at various locations along the bus conductors 104. Circuit breakers 117 can be used between sources and/or loads and the bus conductors 104.

In some examples, the power sources 110 are sized to supply one or more loads that are connected to the bus conductors adjacent thereto to reduce line losses such as I²R losses for longer supply distances. As used herein, adjacent means within a predetermined distance. In some examples, the predetermined distance is less than or equal to 10 meters. In other examples, the power sources 110 and the corresponding loads are connected in contiguous fashion without intervening sources and loads of other source/load pairs 118. In still other examples, the source/load pairs 118 are connected to the bus conductors randomly at any location (relative to other source/load pairs) and power sharing occurs between source/load pairs 118 across the bus conductors.

As can be appreciated, source/load pairs 118 including a power source and a plurality of loads can be connected to the DC bus. The source/load pairs 118 can have different sizes/capacity to accommodate small, medium and large additions to DC bus that correspond to the level of increased demand. In some examples, the power sources 110 are slightly oversized to supply the one or more loads that are arranged nearby and to provide some excess capacity to be shared with other loads on the same DC bus or for loads located in other DC busses. In some examples, the power sources 110 are oversized by a predetermined amount such as 5%, 10%, 15% or 20%.

One or more uninterruptible power sources (UPS) 120 may be provided to supply backup power as needed. In some examples, the UPS 120 includes an array of batteries 122 that are connected by a DC/DC converter 124 to the bus conductors 104. In some examples, the UPS 120 operates at an output voltage level that is lower than a typical operating voltage level that is output by the power sources 110. As a result, the diodes 116 will normally be reverse biased until the voltage on the bus conductors 104 is less than the output voltage level of the UPS 120. This condition typically occurs when one or more of the power sources 110 drop out, current demand exceeds supply and/or the voltage on the bus conductors 104 falls.

Various loads 130-1, 130-2, ..., and 130-L are connected by DC/DC converters 132-1, 132-2, and 132-L to the bus conductors 104 (where L is an integer greater than zero). As described above, some of loads may be grouped and arranged near a power source to create source/load pairs 118. Some of the loads may include server racks 140-1, ..., 140-L or storage arrays that are connected by DC/DC converters 142-1, ... 142-L and diodes 116 to the bus conductors 104 in a similar manner. Some of racks may be grouped and arranged at near a power source without intervening loads or sources.

As described above, the power source 110-1 may be sized with sufficient capacity to supply current $I_{L1}$ to $I_{LL}$ to adjacent loads 130-1 ... 130-L. The power source 110-2 may be sized with sufficient capacity to supply current $I_{R1}$ to $I_{RR}$ to the racks 140-1 ... 140-L located nearby. However, some redundancy is also provided in the system in the event that the power source 110-1 is unable to supply all of the current required by the racks 140-1 ... 140-L located nearby. In that event, the power source 110-2 supplies excess current Is to the racks 140-1 ... 140-L as needed.

In a DC bus architecture 150 shown in FIG. 3B, the array of batteries 122 may be charged by charging circuits 160 that are connected to the bus conductors 104 by diodes 116. In a DC bus architecture 200 shown in FIG. 3C, bus conductors 210 are connected together to form a ring architecture. Both of the DC architectures 150 and 200 allow current sharing of excess capacity of the power sources as needed.

Figure 4A:
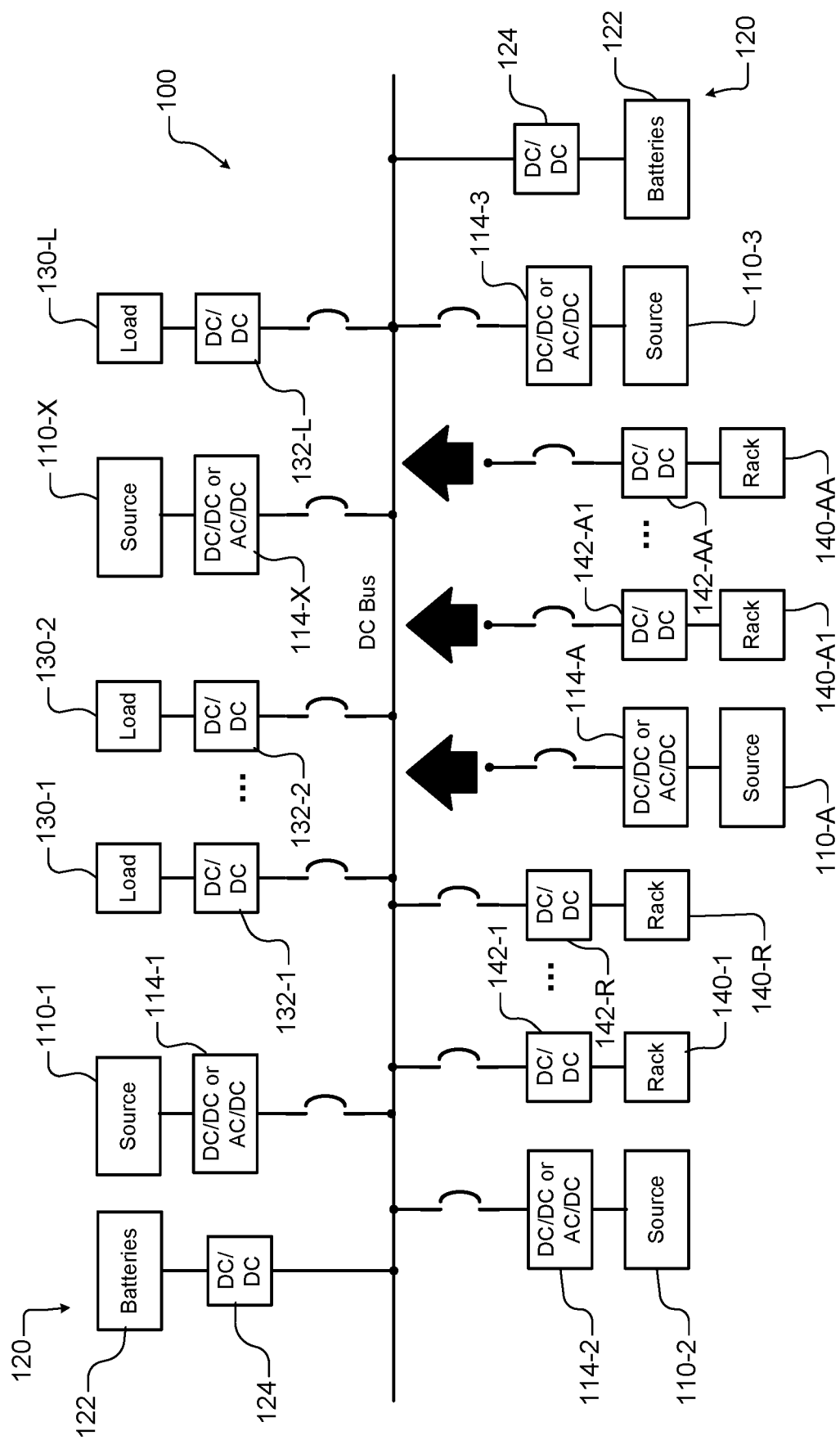
FIGS. 4A and 4B are functional block diagrams of examples of DC bus architectures with additional source/load pairs being added according to the present disclosure.
Figure 4B:
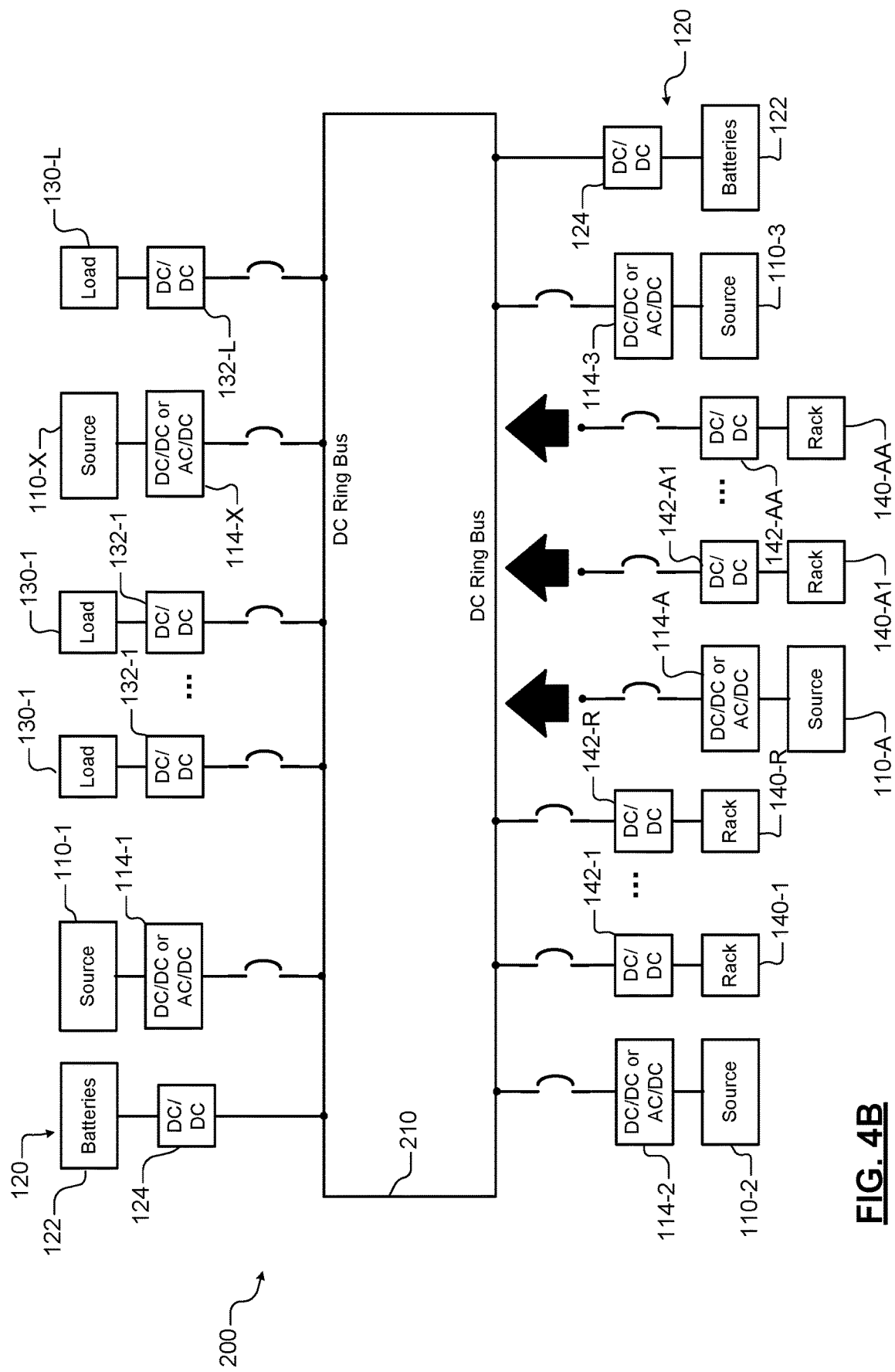

Referring now to FIGS. 4A and 4B, additional advantages are provided by the DC bus architectures described herein. Additional loads such as racks, storage arrays, or other loads can be added and supplied by the DC bus architecture 100 without the prior problems associated with AC synchronization. In FIG. 4A, an additional sources 110-A and converters 114-A are connected to the bus conductors 104 as needed to increase power supply capacity of the DC bus architecture 100. Likewise, additional loads such as racks 140-A1 ... 140-AA and DC/DC converters 142-A1 ... 142-AA can also be connected to the bus conductors 104 as needed to increase power/storage capacity of the datacenter. A similar approach can be used to add power/storage capacity to the DC bus architecture 200 shown in FIG. 4B.

The power/load capacity changes can be added without shutting down the datacenter and/or encountering synchronization issues. Furthermore, the flexibility is achieved without the need to oversize the power capacity of the power bus in advance as in prior datacenter architectures.

Figure 5A:
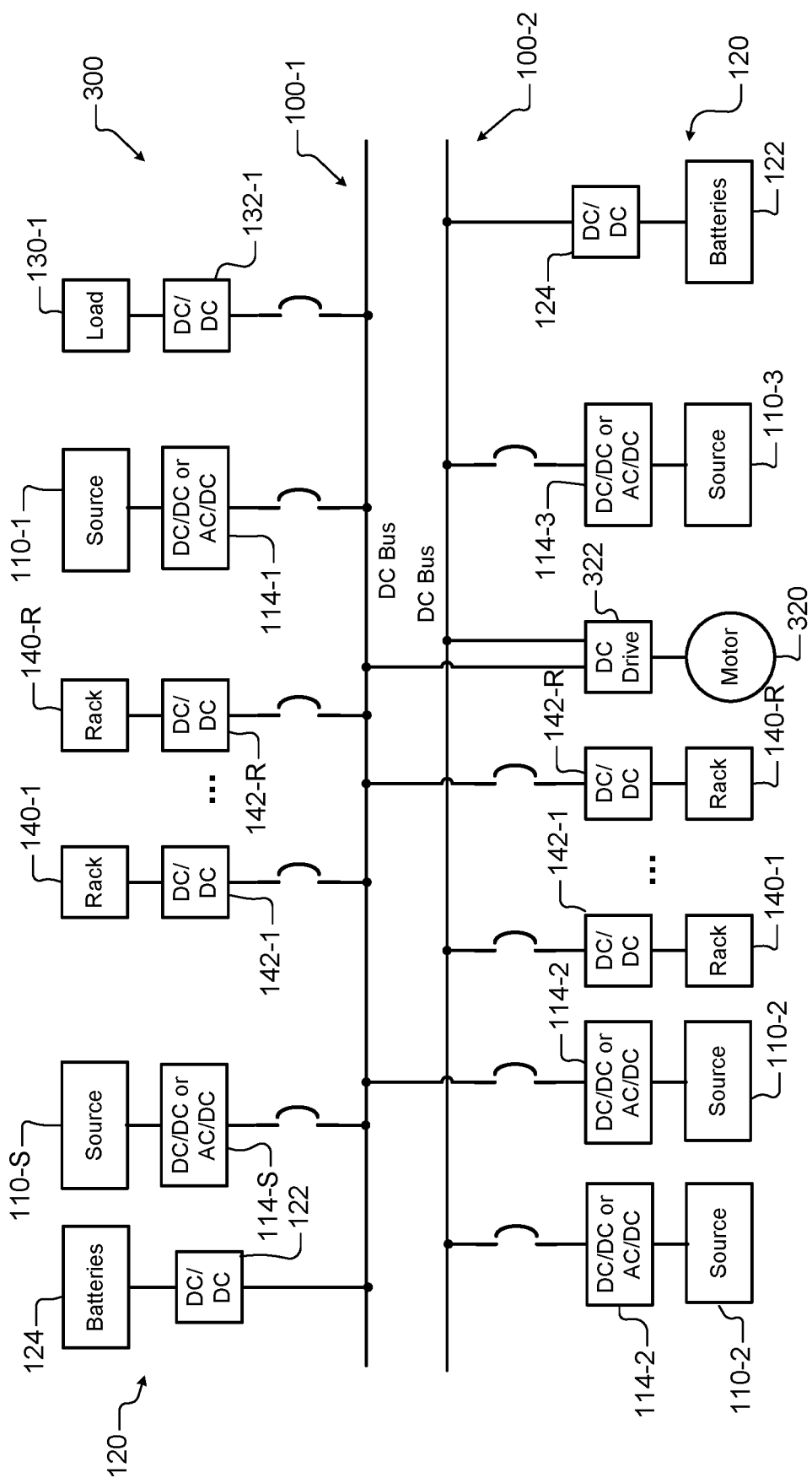
FIGS. 5A and 5B are functional block diagrams of examples of dual-bus DC bus architectures according to the present disclosure.
Figure 5B:
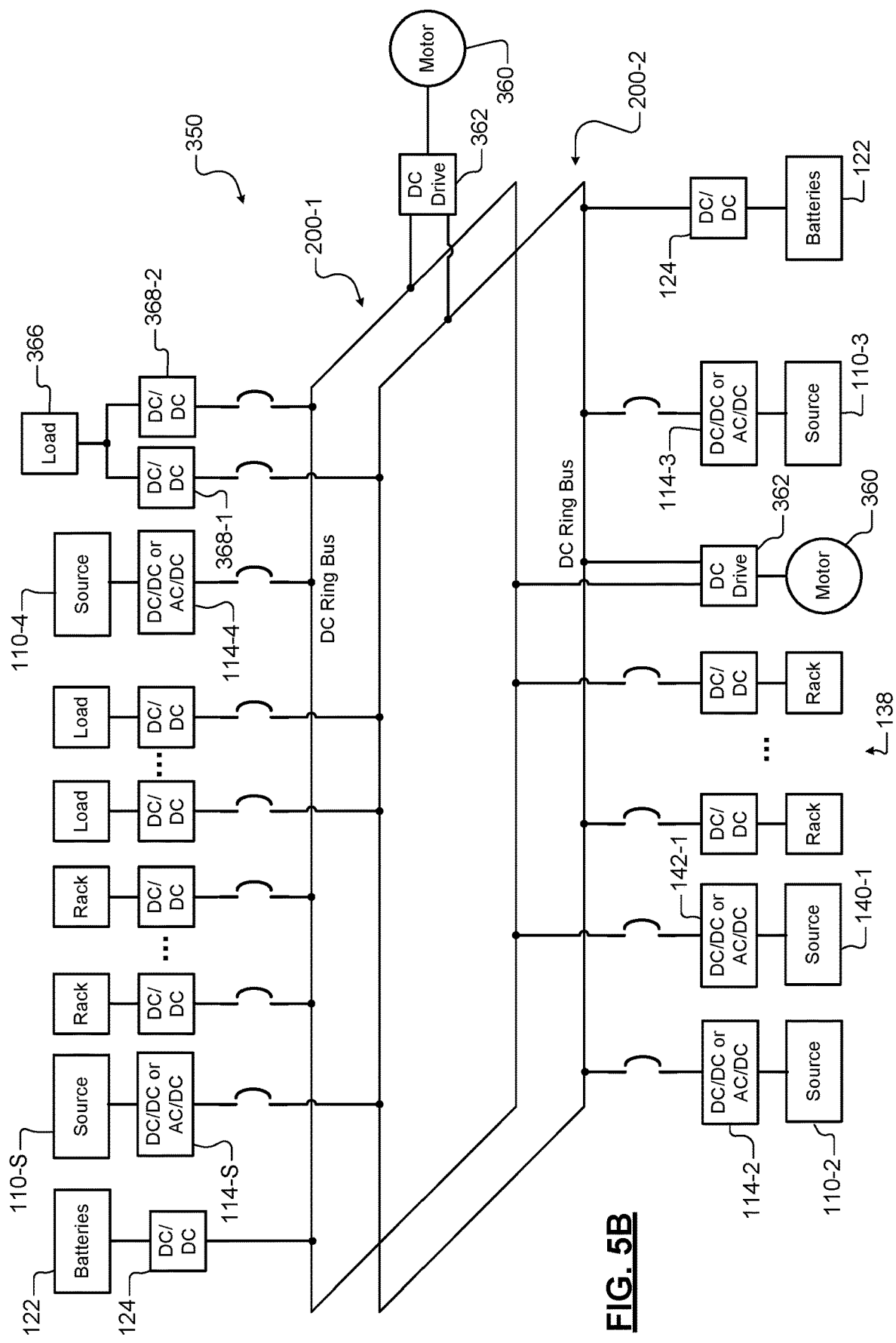

Referring now to FIGS. 5A and 5B, the DC bus architectures shown above FIGS. 3A and 3C can be extended to corresponding dual-bus architectures shown in FIGS. 5A and 5B, respectively. In FIG. 5A, another DC bus architecture 300 is shown. First and second DC busses 100-1 and 100-2 (similar to those described above) are provided. Some of the loads are connected to only one of the DC busses 100-1 or 100-2 while others of the loads (such as motor 320 and DC drive circuit 322) are connected to both of the DC busses 100-1 and 100-2. As described above, the loads in each of the DC busses 100-1 and 100-2 can pull current as needed from excess supply capacity of other adjacent power sources 110 connected to the same DC bus. Likewise additional loads or sources can be added to the DC busses 100-1 and 100-2 as needed without the need to address synchronization issues.

In FIG. 5B, a DC ring bus architecture 350 is shown. First and second DC busses 200-1 and 200-2 (similar to those described) above are provided. Some of the loads are connected to one of the DC bus architectures 200-1 or 200-2 and others of the loads (such as motors 360 and DC drive circuits 362 or loads 366 and converters 368-1 and 368-2) are connected to both of the DC busses 200-1 and 200-2. As described above, the loads on each of the DC busses 200-1 and 200-2 can pull current as needed from excess supply capacity of other adjacent power sources connected to the same DC bus. Likewise additional loads or sources can be added to the DC busses 200-1 and 200-2 as needed without the need to address synchronization issues.

As can be appreciated by the foregoing, source/load pairs 118 can be added and removed from the DC busses described herein simply by connecting and disconnecting the source/load pairs 118 without requiring AC synchronization or other complex startup procedures. The source/load pairs 118 are designed to be self-contained in that the power source is sized to supply the loads in the source/load pairs 118 that are being connected. In some examples, the source/load pairs 118 are connected to the bus conductors adjacent to each other (e.g. without intervening source/load pairs) to reduce $I^2R$ losses. In some examples, the power source is sized with some excess capacity that can be shared with other source/loads pairs 118 on the same DC bus or other DC busses that are connected to the DC bus. As a result, excess capacity can be shared within the same DC bus as needed or with other DC busses as needed or on a demand basis if additional load monitoring and connection controls are used.

Figures 6A, 6C:
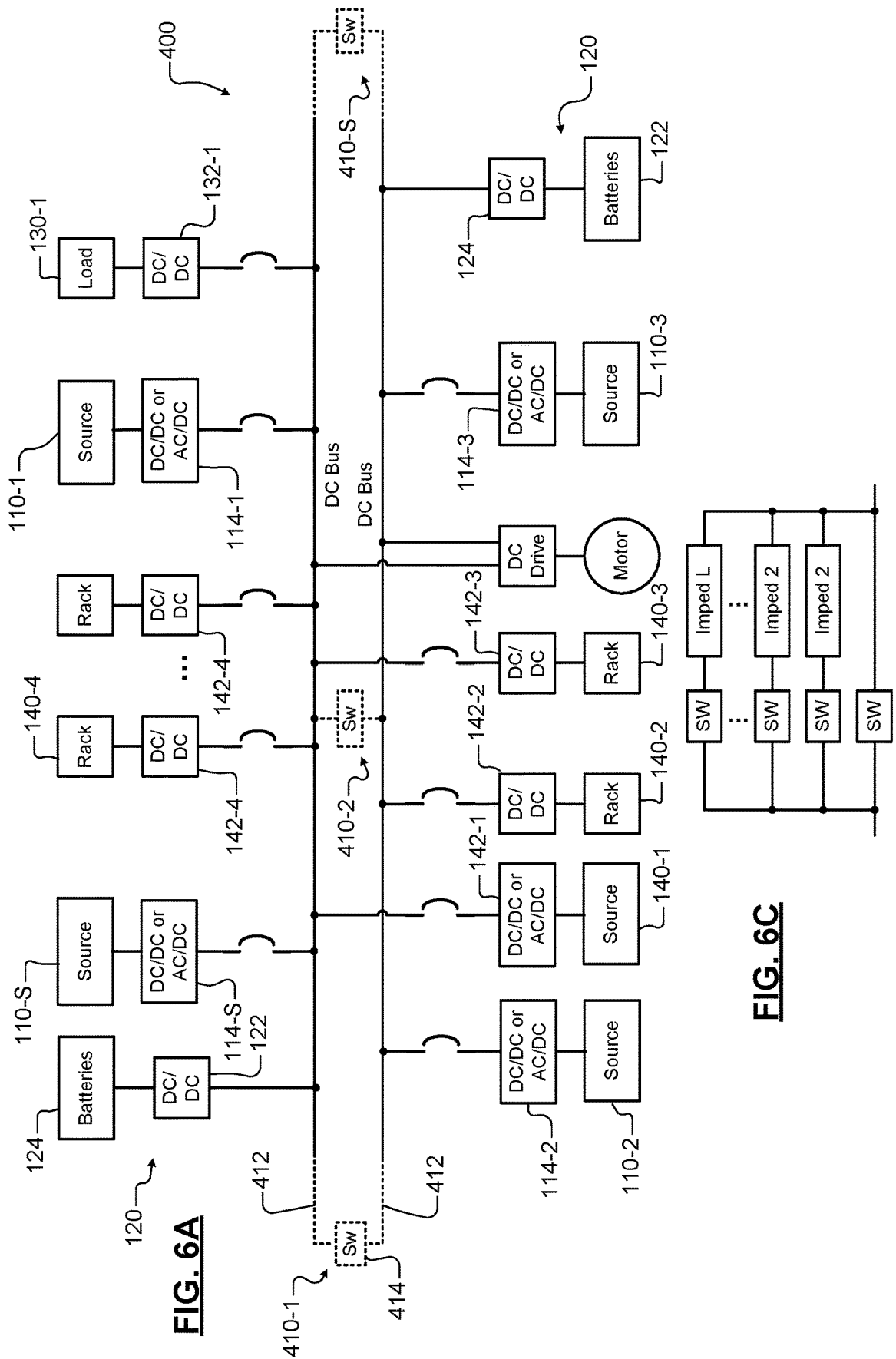
FIGS. 6A and 6B are functional block diagrams of examples of current sharing in dual-bus DC bus architectures according to the present disclosure.
FIG. 6C is a functional block diagram of a switch array including variable impedance paths for connecting busses.
Figure 6B:
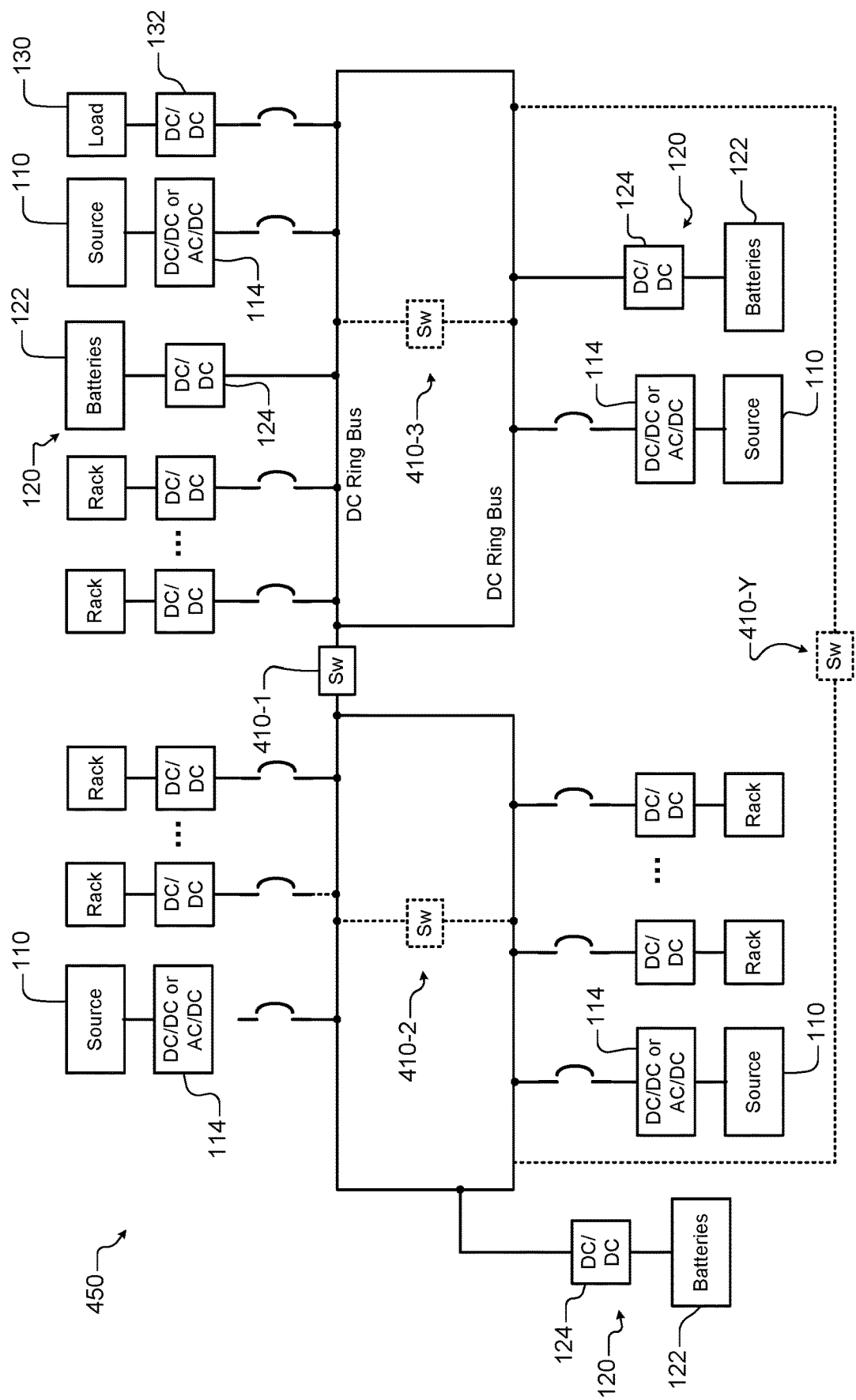

Referring now to FIGS. 6A and 6B, connecting devices can be used to connect two or more DC busses together to create other current sharing arrangements. In FIG. 6A, another DC bus architecture 400 is shown to include first and second DC busses 100-1 and 100-2. One or more bus connecting devices 410-1, 410-2, ... 410-S (collectively bus connecting devices 410) may be provided. Each of the bus connecting devices 410 includes bus conductors 412 and switches 414 that can be used to selectively connect different portions of the first and second DC busses 100-1 and 100-2 together to provide additional points of current sharing between the sources and loads. While switches 414 are shown, other devices such as conductors, circuit breakers, diodes, anti-parallel diodes, etc. can be used.

In the example shown in FIG. 6A, the bus connecting devices 410-1 and 410-2 are located at opposite ends of the first and second DC busses 100-1 and 100-2. The bus connecting device 410-3 is located at a mid-portion of the first and second DC busses 100-1 and 100-2. Different DC bus architectures can be created depending upon which ones of the connecting devices are used. For example, closing the bus connecting devices 410-1 and 410-2 converts the first and second DC busses 100-1 and 100-2 into a ring bus architecture. As can be appreciated, other combinations will define other DC bus architectures.

In FIG. 6B, a DC bus architecture 450 is shown. One or more bus connecting devices 410-1, 410-2, . . . 410-Y (collectively bus connecting devices 410) (where Y is an integer greater than one) can be used to create additional current sharing between first and second DC busses 200-1 and 200-2. For example, a first bus connecting devices 410-1 (or 410-Y) can be used to connect the first and second DC busses 200-1 and 200-2 together. Therefore, excess current supply capacity of sources in the first and second DC busses 200-1 and 200-2 can be shared. Additional sharing can be provided by connecting the first and second DC busses 200-1 and 200-2 in other locations as needed. For example, bus connecting devices 410-2 and/or 410-3 can be used to increase current sharing capacity within a given ring bus.

Referring now to FIG. 6C, the switches SW, $SW_1$, $SW_2$, . . . , $SW_L$ between the busses can provide different paths having variable impedances (short, $Imped_1$, $Imped_2$, . . . , and $Imped_L$) to allow certain connections between busses to be favored over other connections to other busses. The $Imped_1$, $Imped_2$, . . . , and $Imped_L$ can include resistors, inductors, capacitors, and/or combinations of resistors, inductors, capacitors. In use, zero, one or more of the switches SW, $SW_1$, $SW_2$, . . . , $SW_L$ can be closed or opened to provide varying impedance connections.

Figure 7A:
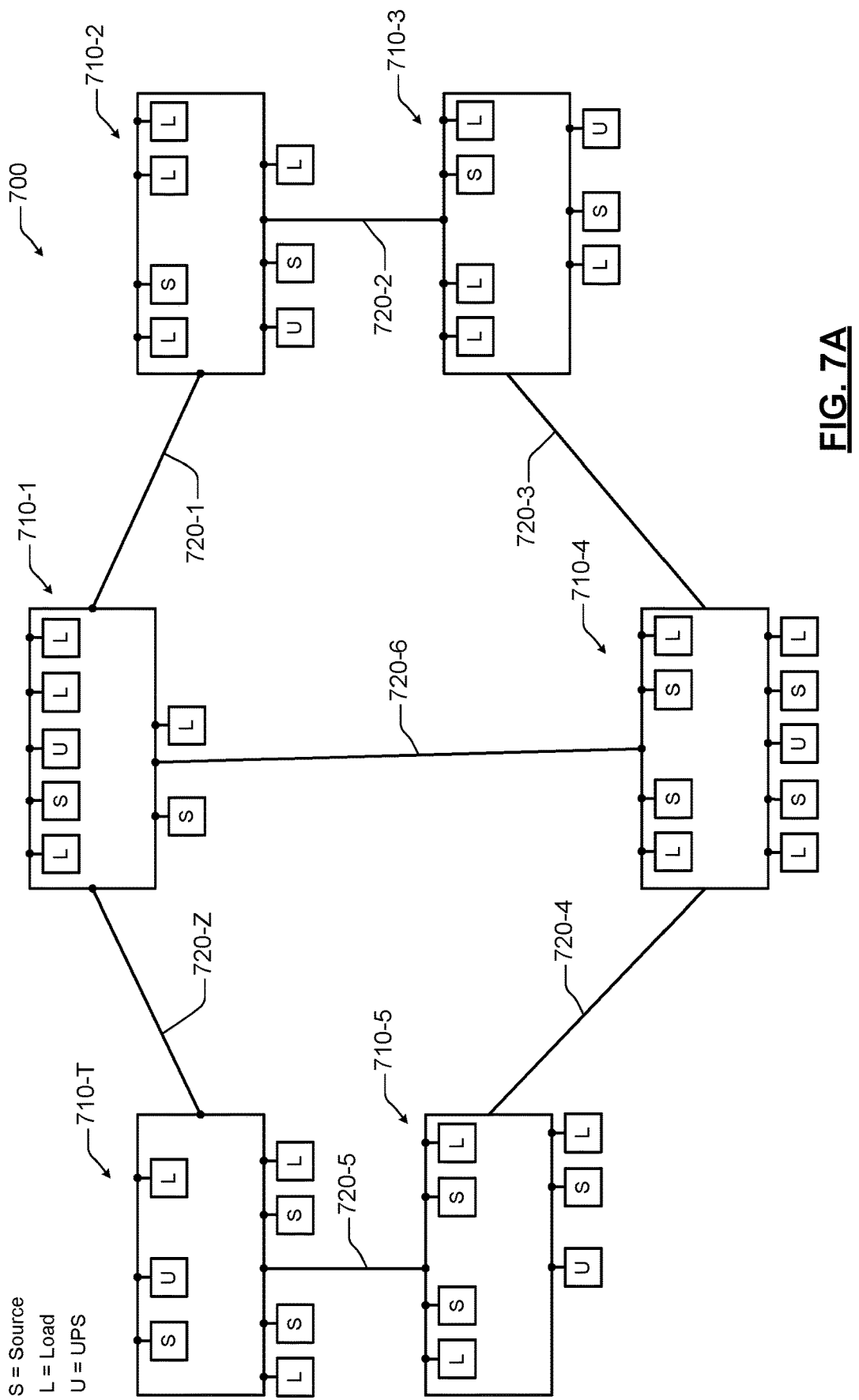

Referring now to FIG. 7A, another bus current sharing arrangement is shown. A bus architecture 700 includes DC busses 710-1, 710-2, . . . 710-T (collectively DC busses 710) (where T is an integer greater than one). While DC busses 710 are shown in a ring configuration, non-ring DC busses can be used. Bus bridging conductors 720-1, 720-2, . . . 720-Z (where Z is an integer greater than zero) provide connections between one or more of the DC busses 710 to allow excess current capacity to be shared between the DC bus busses 710

In FIGS. 8A and 8B, another bus current sharing arrangement is shown. In FIG. 8A, a DC bus architecture 800 includes DC busses 810-1, 810-2, . . . 810-R (collectively DC busses 810) (where R is an integer greater than one). While DC busses 810 are shown in a ring configuration, non-ring DC busses can be used. Bus bridging conductors 820-1, 820-2, . . . 820-B and switches 830-1, 830-2, . . . 830-B selectively provide connections between the DC busses 810 to allow excess current capacity to be shared between the DC busses 810 (where B is an integer greater than zero). Current sensors (CS) can be used to sense current consumed by the loads (L) and/or current supplied by the sources (S).

In FIG. 8B, a controller 850 includes a bus architecture control application 854. The controller 850 communicates with the current sensors 856 and switches 830. The bus architecture control application 854 monitors current consumed by the loads L and/or supplied by the sources S and selectively configures the switches SW to provide current sharing as needed.

Figure 9:
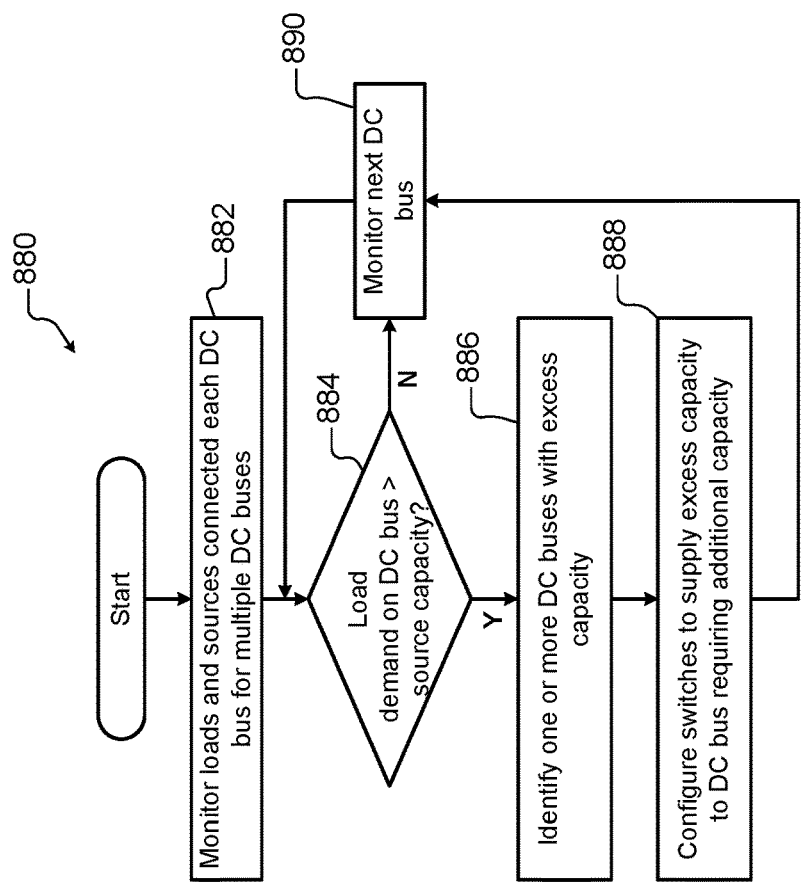

Referring now to FIG. 9, a method 880 for operating the bus architecture 800 shown in FIGS. 8A and 8B is shown. At 882, the method monitors current drawn by the loads L and power supplied by the power sources S connected to each of the DC busses. At 884, the method determines whether the load demand on one or more of the DC busses is greater than the source capacity of the DC bus. If 884 is true, the method identifies one or more DC busses with excess capacity at 886. At 888, the method selectively configures the switches SW to supply excess capacity to the DC bus requiring additional capacity. Control continues from 884 (when false) and from 888 with 890 where the method monitors the next DC bus. Control continues from 890 with 884.

In some examples, the busses are pre-emptively or proactively connected together for maintenance, resiliency or other purposes. In some examples, the bus architecture control application optimizes interconnection of the busses. For example, certain busses may be connected prior to the occurrence of an increased load demand. For example, multiple motors may be started at the same time in some applications. In some examples, the bus architecture control application connects one or more additional busses before startup and then disconnects the busses The bus architecture control application anticipates demand for current and enables flows through the system of interconnected busses. In some examples, the switches described herein are used. In other examples, variable impedance connections are used. The variable impedance connections are managed programmatically along with bus switches to favor certain connections. For example, a secondary or tertiary power path is given one impedance weight to bias power on specific paths for maintenance or repair conditions. In other examples, power supplied by preferred power sources (such as renewable sources) are selected over other secondary power sources.

Figure 10:
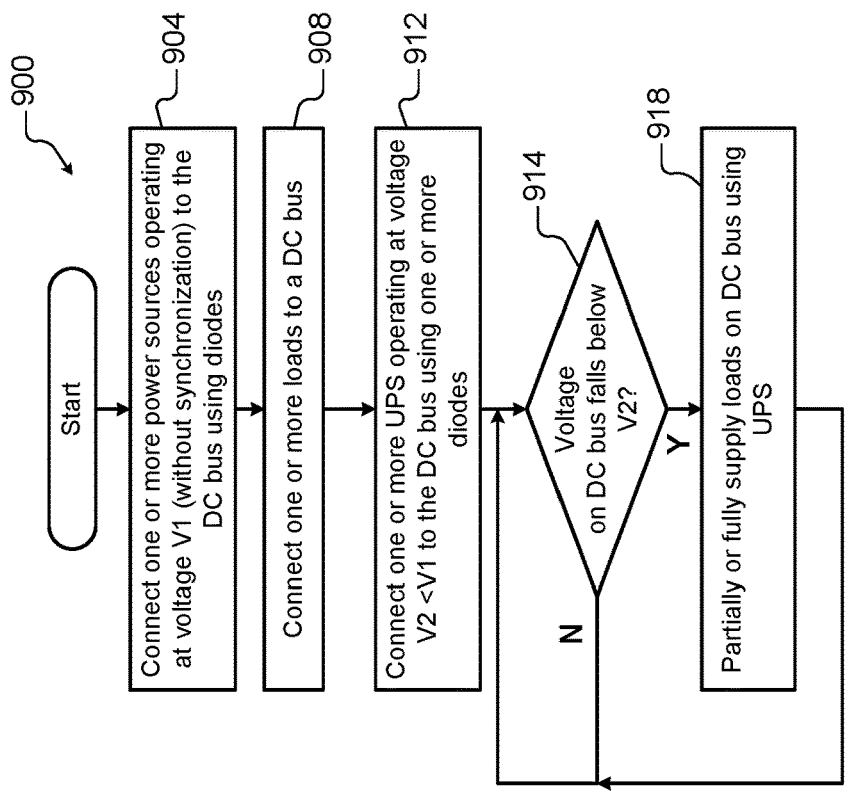
FIGS. 9-12 are flowcharts of examples of methods for operating a DC bus according to the present disclosure.

Referring now to FIG. 10, a method 900 for operating a DC bus is shown. At 904, one or more power sources operating at a first voltage V1 are connected to the DC bus using diodes. At 908, one or more loads are connected to a DC bus. At 912, one or more UPS (operating at a second voltage V2 that is lower than the first voltage V1) are connected to the DC bus. At 914, when the voltage on the DC bus falls below V2, the diode is forward biased and the loads on the DC bus are fully or partially supplied using the UPS.

Figure 11:
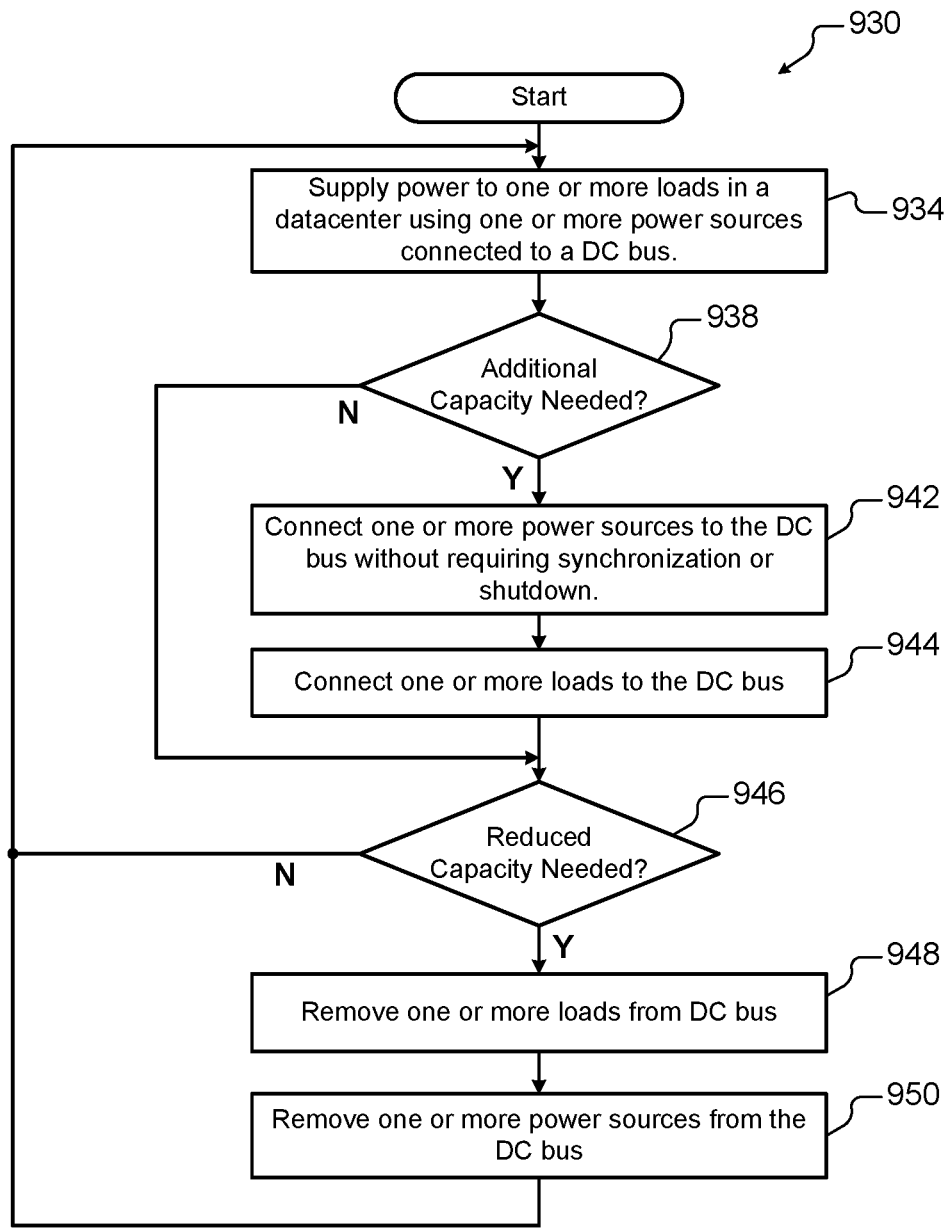

Referring now to FIG. 11, the method 930 for operating a DC bus is shown. At 934, power is supplied to one or more loads in a datacenter using one or more power sources connected to a DC bus. At 938, the method determines whether additional capacity is needed. If 938 is true, one or more power sources are connected to the DC bus without requiring AC synchronization or shut down. At 944, one or more additional loads are optionally connected to the DC bus. At 946, the method determines whether reduced capacity is needed. If reduced capacity is needed at 946, the method removes one or more loads from the DC bus at 948. At 950, one or more power sources are optionally removed from the DC bus.

Figure 12:
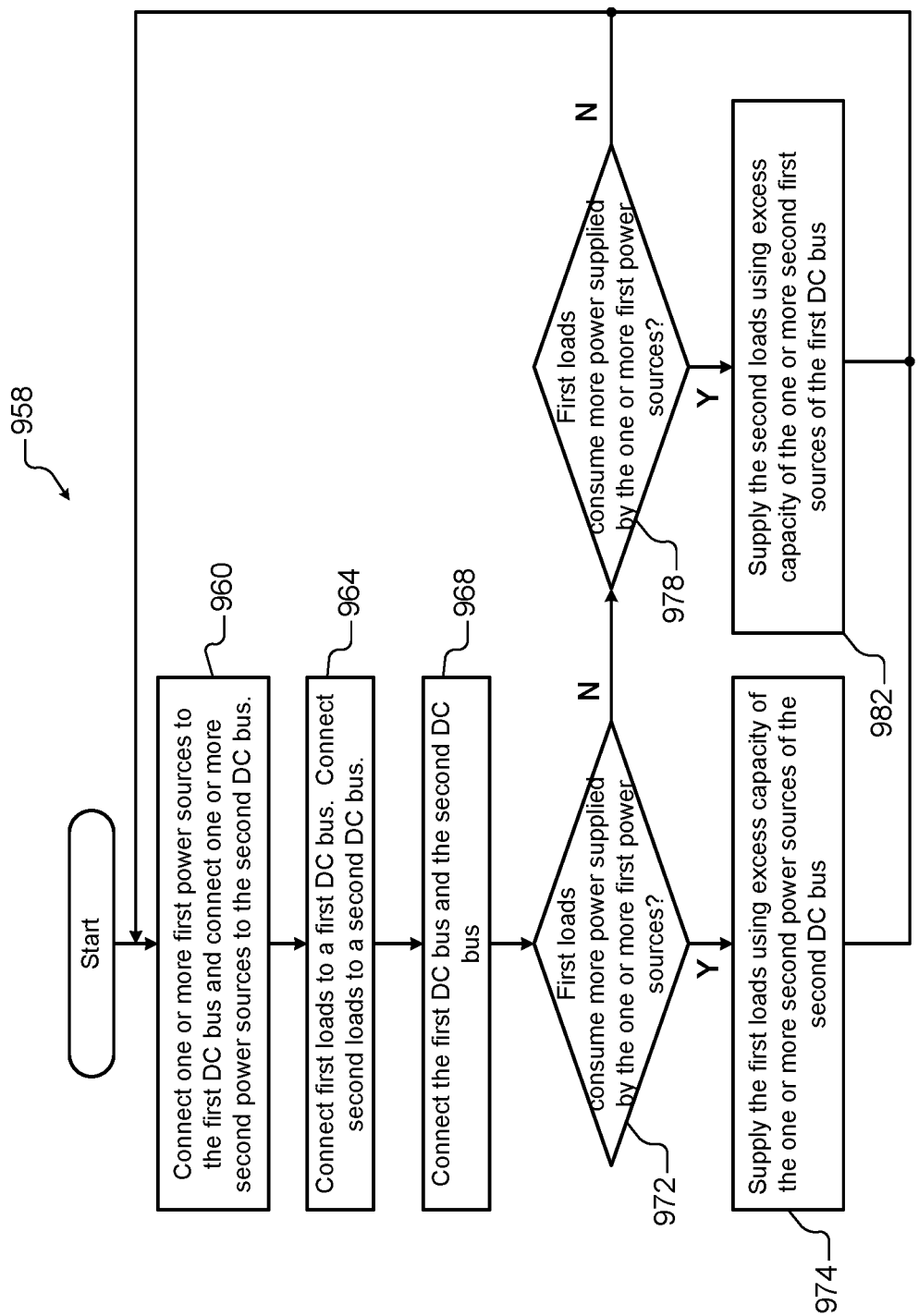

Referring now to FIG. 12, a method 958 for operating the DC bus is shown. At 960, one or more first power sources are connected to the first DC bus and one or more second power sources are connected to the second DC bus. At 964, first loads are connected to a first DC bus and second loads are connected to a second DC bus. At 968, the first DC bus and the second DC bus are connected. In some examples, the first DC bus and the second DC bus are directly connected. In other examples, the first DC bus and the second DC bus are connected by a circuit breaker, a switch, one or more diodes, anti-parallel diodes or other connection device.

At 972, the method determines whether first loads connected to the first DC bus consume more power supplied by the one or more first power sources of the first DC bus. If 972 is true, the method continues at 974 and supplies the first loads using excess capacity of the one or more second power sources of the second DC bus. If 972 is false, the method determines whether second loads connected to the second DC bus consume more power supplied by the one or more second power sources of the second DC bus. If 972 is true, the method continues at 974 and supplies the second loads using excess capacity of the one or more first power sources of the first DC bus.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

The invention claimed is:

1. A bus architecture for supplying power to loads m a datacenter, comprising:
   first and second direct current (DC) buses individually comprising:
      a DC bus conductor;
      a power source;
      a first diode having a cathode connected to the DC bus conductor;
      a voltage converter connected to the power source and to an anode of the first diode, wherein power output by the power source via the converter is supplied to the DC bus conductor at a first voltage level;
      a load configured to consume power from the DC bus conductor;
   a DC/DC converter connecting the load to the DC bus conductor, the DC/DC converter being configured to convert power from the first voltage level to a second voltage level less than the first voltage level;
   a second diode having an anode connected to the DC bus conductor and a cathode connected to the DC/DC converter;
   an electrical switch between the first and second DC buses; and
   a controller operatively coupled to the first and second DC buses and the electrical switch, wherein the controller is configured to:
   monitor a power consumption of the load on the DC bus conductor of the first DC bus;
      determining whether the monitored power consumption exceeds a capacity of the power source on the first DC bus and whether the power source on the second DC bus has excess capacity; and
      in response to determining that the monitored power consumption exceeds a capacity of the power source on the first DC bus and the power source on the second DC bus has excess capacity, actuate the electrical switch to adjust an impedance weight in the bus architecture to bias power from the power source of the second DC bus to the load on the DC bus conductor of the first DC bus.

2. The bus architecture of claim 1 wherein the DC bus conductor of the first or second DC bus is connected in a ring configuration.

3. The bus architecture of claim 1 wherein the load of the first DC bus comprises a server rack including a switch and a plurality of servers.

4. The bus architecture of claim 1 wherein the bus architecture further comprising:
   a third DC bus comprising another DC bus conductor operatively coupled to the first or second DC bus via another electrical switch.

5. The bus architecture of claim 4, further comprising a bridging bus conductor connecting the DC bus conductor of the first DC bus to the DC bus conductor of the second DC bus.

6. The bus architecture of claim 5 wherein the DC bus conductor of the first DC bus is connected in a ring configuration and the DC bus conductor of the second DC bus is also connected in a ring configuration.

7. The bus architecture of claim 4, further comprising:
   a connecting component selected from a group consisting of a switch, a circuit breaker, a diode and anti-parallel diodes; and a bridging bus conductor connecting the connecting component between the DC bus conductor of the first DC bus and the DC bus conductor of the second DC bus.

8. The bus architecture of claim 1 wherein the power source is a first power source, and wherein the bus architecture further comprises a second power source operating at the first voltage level connected to the DC bus conductor without AC synchronization.

9. The bus architecture of claim 8 wherein the load is a first load, and wherein the bus architecture further comprises a second load connected to the DC bus conductor of the first DC bus to provide additional load capacity to the first DC bus.

10. The bus architecture of claim 1, further comprising a plurality of diodes connecting a plurality of additional loads to the DC bus conductor of the first or second DC bus.

11. An electrical system for supplying power to multiple servers in a datacenter, the electrical system comprising:
first and second direct current (DC) buses individually having:
a bus conductor configured to carry a DC current at a first voltage level;
a power source configured to provide electrical power to the multiple servers via the bus conductor;
a voltage converter configured to receive the electrical power from the power source at a supply voltage and convert the received electrical power from the supply voltage to the first voltage level;
a first diode having a cathode connected to the bus conductor and an anode connected to an output of the voltage converter;
a DC/DC converter connecting the multiple servers to the bus conductor, the DC/DC converter being configured to convert the electrical power from the first voltage level to a second voltage level less than the first voltage level; and
a second diode having a cathode connected to the bus conductor and an anode connected to an output of the DC/DC converter;
an electrical switch between the first and second DC buses; and
a controller operatively coupled to the first and second DC buses and the electrical switch, wherein the controller is configured to:
monitor a power consumption of the load on the DC bus conductor of the first DC bus;
determining whether the monitored power consumption exceeds a capacity of the power source on the first DC bus and whether the power source on the second DC bus has excess capacity; and
in response to determining that the monitored power consumption exceeds a capacity of the power source on the first DC bus and the power source on the second DC bus has excess capacity, actuate the electrical switch to adjust an impedance weight in the bus architecture to bias power from the power source of the second DC bus to the load on the DC bus conductor of the first DC bus.

12. The electrical system of claim 11, wherein the bus conductor of the first or second DC bus is connected in a ring configuration.

13. The electrical system of claim 11, further comprising a switch between the second diode and the DC/DC converter of the first or second DC bus.

14. The electrical system of claim 11, further comprising:
a battery on the first DC bus; and
a third diode having a cathode connected to the bus conductor of the first DC bus and an anode connected to the battery.

15. The electrical system of claim 11, further comprising:
a battery on the first DC bus;
a third diode having a cathode connected to the bus conductor of the first DC bus and an anode connected to the battery;
a charger configured to charge the battery; and
a fourth diode having a cathode connected to the charger and an anode connected to the bus conductor of the first DC bus.

16. The electrical system of claim 11 wherein the power source is located within ten meters of the multiple servers of the first DC bus.

17. The electrical system of claim 11 wherein:
the power source is a first power source;
the multiple servers are a first load; and
the first power source and the first load forms a first pair of power source and load; and
the electrical system further includes multiple additional pairs of power source and load arranged along the bus conductor in a contiguous a fashion without any intervening power source or load between the first power source and the first load.

18. The electrical system of claim 11 wherein the power source is a first power source, and wherein the electrical system further comprises a second power source operating at the first voltage level connected to the bus conductor without AC synchronization.

19. The electrical system of claim 11 wherein the multiple servers are a first load, and wherein the bus architecture further comprises a second load connecting to the bus conductor to provide additional load capacity.

* * * * *